US009553601B2

(12) United States Patent
Bordow

(10) Patent No.: US 9,553,601 B2
(45) Date of Patent: Jan. 24, 2017

(54) CONVERSION OF ANALOG SIGNAL INTO MULTIPLE TIME-DOMAIN DATA STREAMS CORRESPONDING TO DIFFERENT PORTIONS OF FREQUENCY SPECTRUM AND RECOMBINATION OF THOSE STREAMS INTO SINGLE-TIME DOMAIN STREAM

(71) Applicant: Keysight Technologies, Inc., Minneapolis, MN (US)

(72) Inventor: Robin A. Bordow, Petaluma, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 57 days.

(21) Appl. No.: 13/972,642

(22) Filed: Aug. 21, 2013

(65) Prior Publication Data

US 2015/0054566 A1 Feb. 26, 2015

(51) Int. Cl.
*H04B 3/46* (2015.01)
*H04B 17/00* (2015.01)
*H04Q 1/20* (2006.01)
*H03M 1/12* (2006.01)
*G01R 13/02* (2006.01)
*G01R 23/16* (2006.01)

(52) U.S. Cl.
CPC ............ *H03M 1/12* (2013.01); *G01R 13/0272* (2013.01); *G01R 23/16* (2013.01)

(58) Field of Classification Search
None
See application file for complete search history.

(56) References Cited

U.S. PATENT DOCUMENTS

| | | | |
|---|---|---|---|
| 6,898,235 B1 * | 5/2005 | Carlin | H04B 1/001 342/147 |
| 8,374,812 B2 * | 2/2013 | Nara | G01R 13/0236 324/76.19 |
| 8,446,144 B2 | 5/2013 | Kuniie et al. | |
| 2012/0076249 A1 | 3/2012 | Seo et al. | |
| 2012/0269252 A1 | 10/2012 | Ward | |
| 2013/0141160 A1 * | 6/2013 | Ohkawara | H03F 1/3247 330/149 |

FOREIGN PATENT DOCUMENTS

JP 2004125426 A 4/2004

* cited by examiner

*Primary Examiner* — Chieh M Fan
*Assistant Examiner* — Wednel Cadeau

(57) ABSTRACT

An electrical signal is processed by digitizing the electrical signal to produce a stream of digitized data in the time domain, wherein the stream has an original frequency spectrum, transmitting the stream to N signal paths (N>1), and down-converting and filtering the stream in each of the N signal paths to produce N streams of digitized data in the time domain, wherein the N streams have N frequency spectra, respectively, and the N frequency spectra cover N different portions of the original frequency spectrum, respectively.

15 Claims, 17 Drawing Sheets

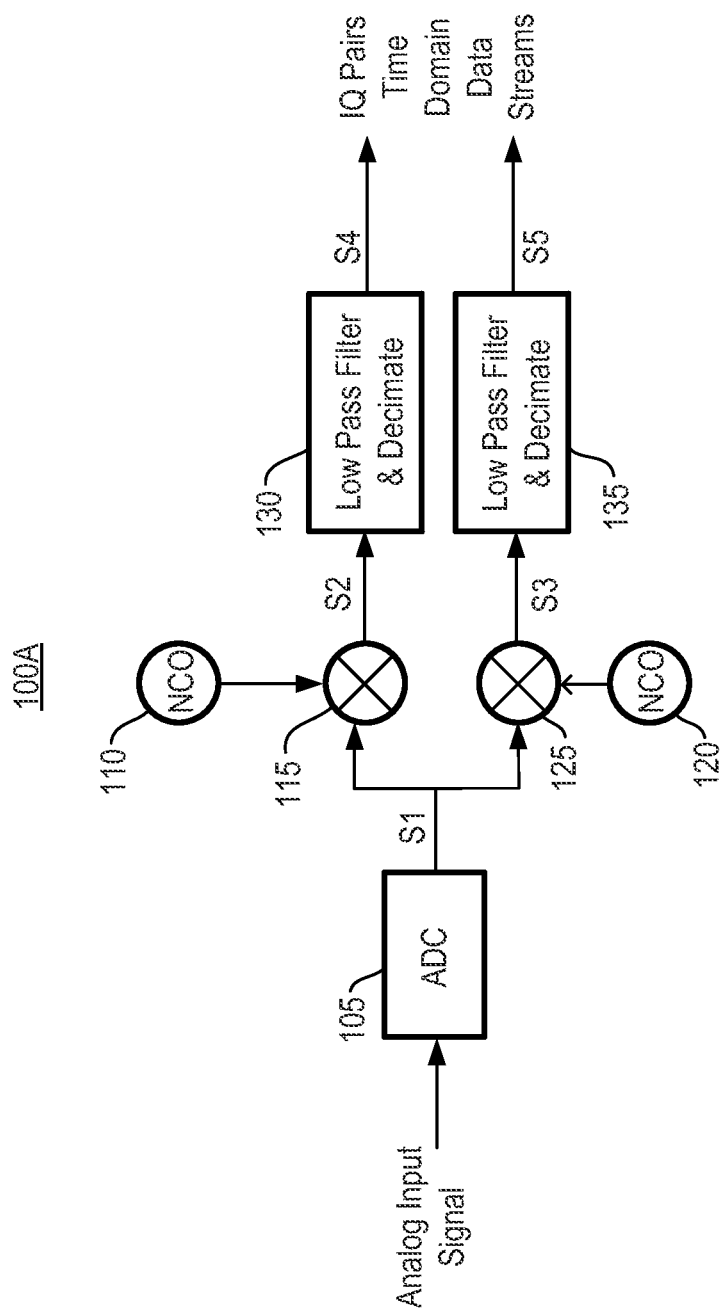

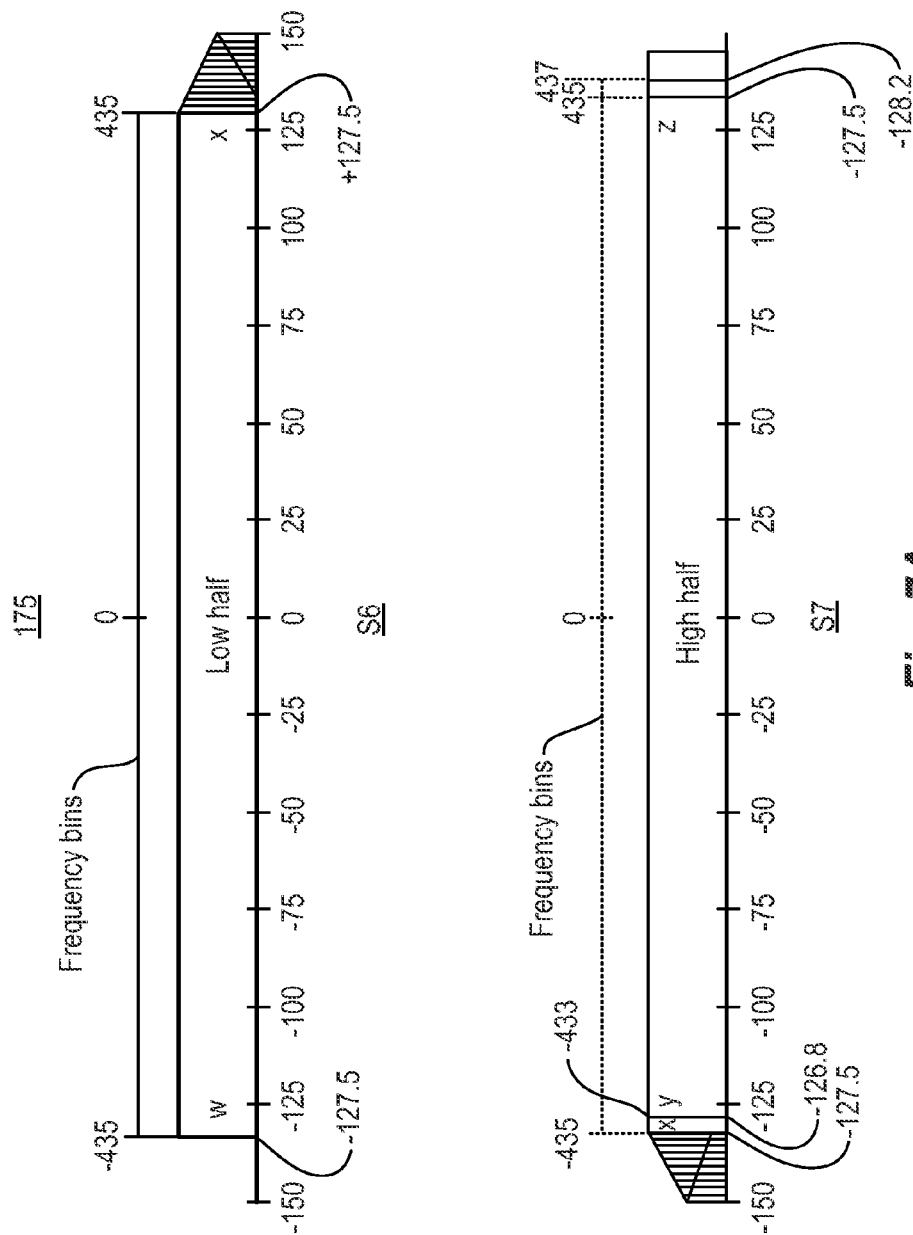

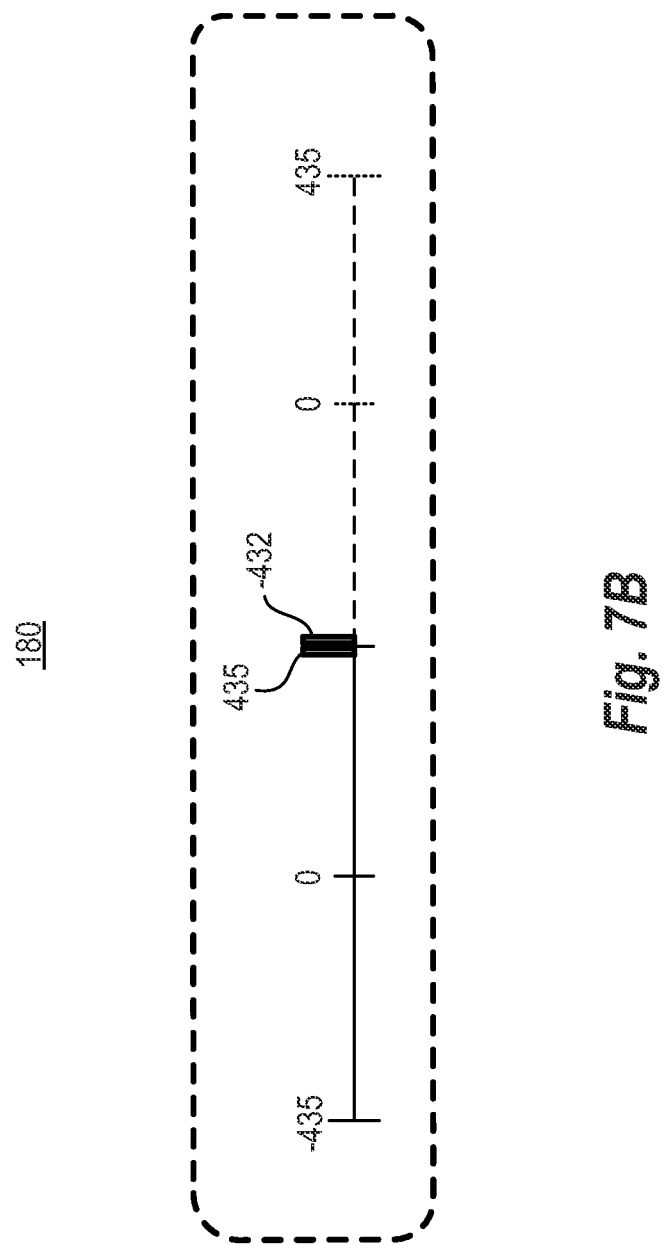

CONVERSION OF ANALOG SIGNAL INTO MULTIPLE TIME-DOMAIN DATA STREAMS CORRESPONDING TO DIFFERENT PORTIONS OF FREQUENCY SPECTRUM AND RECOMBINATION OF THOSE STREAMS INTO SINGLE-TIME DOMAIN STREAM

BACKGROUND

An electronic apparatus may convert an analog input signal into a digital input signal using an analog to digital converter (ADC). This conversion may allow the apparatus to process the converted signal using digital electronic components, such as digital hardware and/or software, for example.

In certain contexts, there may be a mismatch between the sampling rate of the ADC and the processing capability of the digital electronic components. For instance, in a conventional real-time spectrum analyzer (RTSA), the ADC may sample the analog input signal at a rate that is higher than the bandwidth of an RTSA engine used to produce RTSA output signals. Consequently, the RTSA may not be able to process all of the available data in real-time.

Unfortunately, it is generally expensive to improve the processing capability of digital electronic components such as RTSA engines through conventional approaches. Accordingly, there is a general need for new approaches for improving the processing capability of these and other digital electronic components used in conjunction with high performance ADCs.

SUMMARY

In accordance with a representative embodiment, a method of processing an electrical signal comprises digitizing the electrical signal to produce a stream of digitized data in the time domain, wherein the stream has an original frequency spectrum, transmitting the stream to N signal paths (N>1; e.g., N=2), and down-converting and filtering the stream in each of the N signal paths to produce N streams of digitized data in the time domain, wherein the N streams have N frequency spectra, respectively, and the N frequency spectra cover N different portions of the original frequency spectrum, respectively. The down-converting and filtering are typically followed by decimating the N streams.

In some embodiments, processing the N streams using N different RTSA engines to produce N RTSA outputs, and displaying the N RTSA outputs concurrently on a single RTSA display. In such embodiments, processing the N streams may comprise, for instance, performing a Fourier transform on each of the N streams to produce a plurality of frequency bins corresponding to each of the N streams, and identifying overlapping frequency bins between different streams among the N streams. Additionally, the method may further comprise determining an alignment of the different streams within the RTSA display according to the overlapping frequency bins. Also in such embodiments, the method may further comprise embedding synchronization data in each of the N streams, and inspecting the synchronization data in each of the RTSA engines and communicating between the RTSA engines in response to the synchronization data to synchronize the processing of the N streams.

In some embodiments, the method further comprises performing a Fourier transform on each of the N streams to produce N transformed streams, adjusting the phase of the N transformed streams, concatenating the N transformed streams to produce a concatenated stream, and performing an inverse Fourier transform (IFT) on the concatenated stream.

In accordance with another representative embodiment, a system configured to process an electrical signal comprises an ADC configured to digitize the electrical signal to produce a stream of digitized data in the time domain, wherein the stream has an original frequency spectrum, and N signal paths (N>1) each configured to down-convert and filter the stream to produce N streams of digitized data in the time domain, wherein the N streams have N frequency spectra, respectively, and the N frequency spectra cover N different portions of the frequency spectrum, respectively.

In some embodiments, each of the N signal paths comprises a frequency mixer configured to down-convert the stream and a band-pass filter configured to filter the down-converted stream. In such embodiments, the frequency mixer in each of the N signal paths can have a different LO frequency than the frequency mixer in each of the other N signal paths. Moreover, in such embodiments, the system may further comprise N RTSA engines configured to process the N streams, respectively, to produce N RTSA outputs, and an RTSA display processor configured to combine the N RTSA outputs into a single cohesive frequency spectrum. The system may also comprise a display configured to display the single cohesive frequency spectrum produced by the RTSA display processor.

In some embodiments, the system further comprises a component configured to transform each of the N streams from the time domain to the frequency domain adjust the phase, and concatenate the transformed N streams. The component may be further configured to inversely transform the concatenated and transformed N streams from the frequency domain to the time domain. Moreover, concatenation of the transformed N streams may comprise aligning corresponding frequency bins of the transformed N streams and adjusting the phase of all the frequency bins. The system may also comprise a component configured to synchronize operations of the N signal paths by embedding synchronization data in each of the N streams and inspecting the synchronization data in each of the N signal paths.

BRIEF DESCRIPTION OF THE DRAWINGS

The described embodiments are best understood from the following detailed description when read with the accompanying drawing figures. Wherever applicable and practical, like reference numerals refer to like elements.

FIG. 1A is a block diagram illustrating a system configured to convert an analog signal into multiple time domain components corresponding to different portions of a cohesive frequency band, in accordance with a representative embodiment.

FIG. 7A is a conceptual diagram illustrating the operation of an RTSA display processor in the system of FIG. 1D, in accordance with a representative embodiment.

FIG. 7B is a conceptual diagram illustrating the operation of an RTSA display in the system of FIG. 1D, in accordance with a representative embodiment.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate generally to techniques for converting an analog signal into multiple different time-domain data streams each representing a different portion of a cohesive frequency spectrum. These techniques can be used, for instance, in contexts where the analog signal is digitized at a relatively high rate and the resulting data streams are required to be processed at a correspondingly high rate, e.g., in real-time. As one example, suppose an ADC generates digitized data at a rate too high for a single RTSA engine. Under these circumstances, the described techniques can be used to convert the digitized data into two different time-domain data streams each representing only part of the frequency spectrum of the original data. The two different data streams can then be processed separately by two different RTSA engines, and RTSA output data of the two engines can be combined to produce a representation of the original data stream.

Figure 1B:
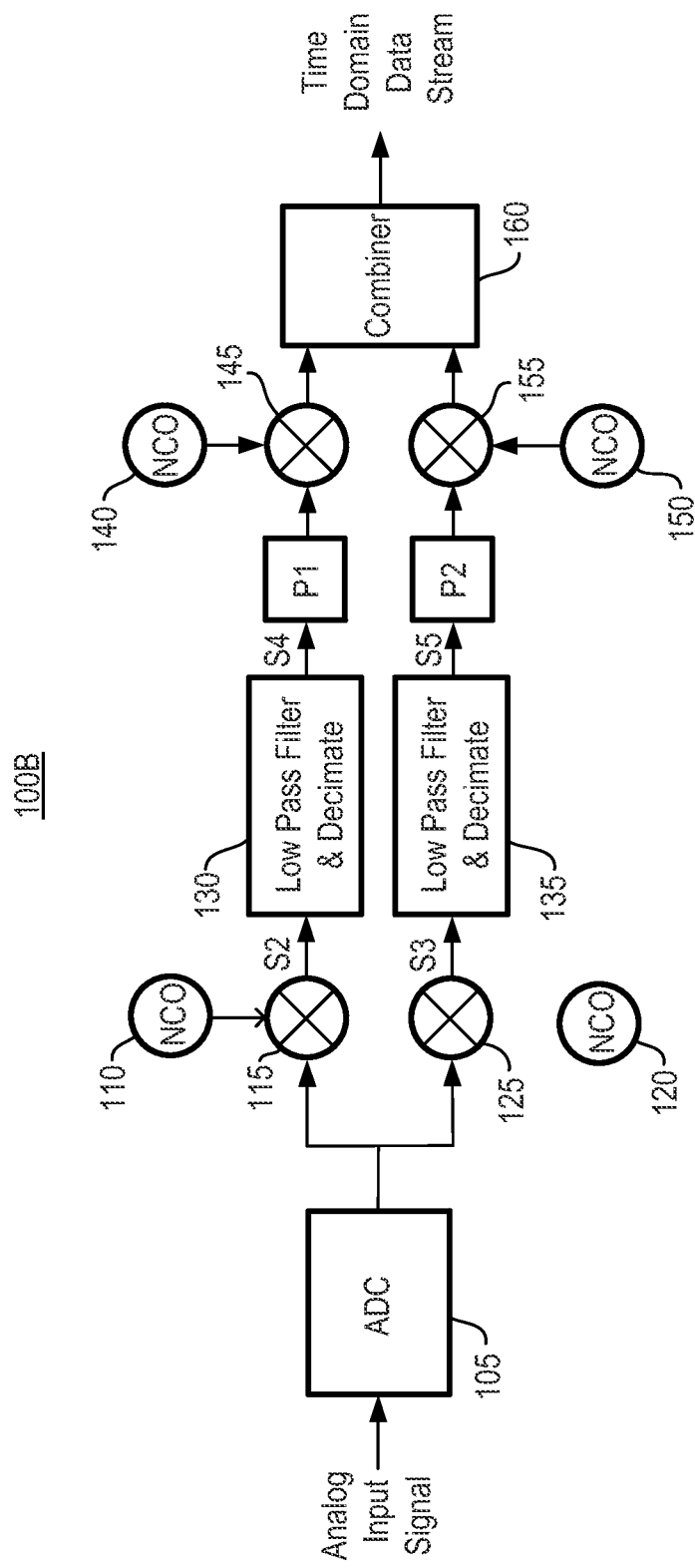
FIG. 1B is a block diagram illustrating another system configured to convert an analog signal into multiple time domain components corresponding to different portions of a cohesive frequency band, and further configured to combine the multiple time domain components into a single output signal, in accordance with a representative embodiment.
Figure 1C:
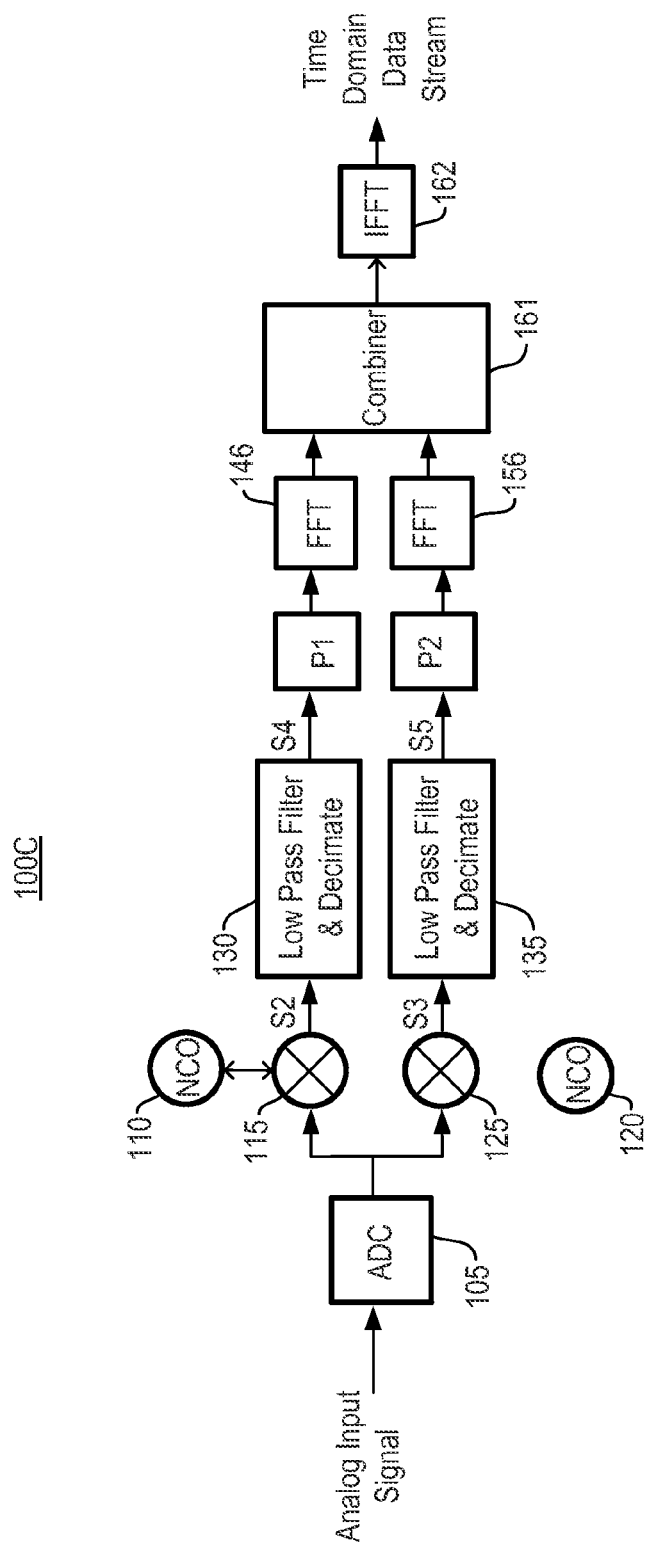
FIG. 1C is a block diagram illustrating another system configured to convert an analog signal into multiple time domain components corresponding to different portions of a cohesive frequency band, and further configured to combine the multiple time domain components into a single output signal, in accordance with a representative embodiment.
Figure 1D:
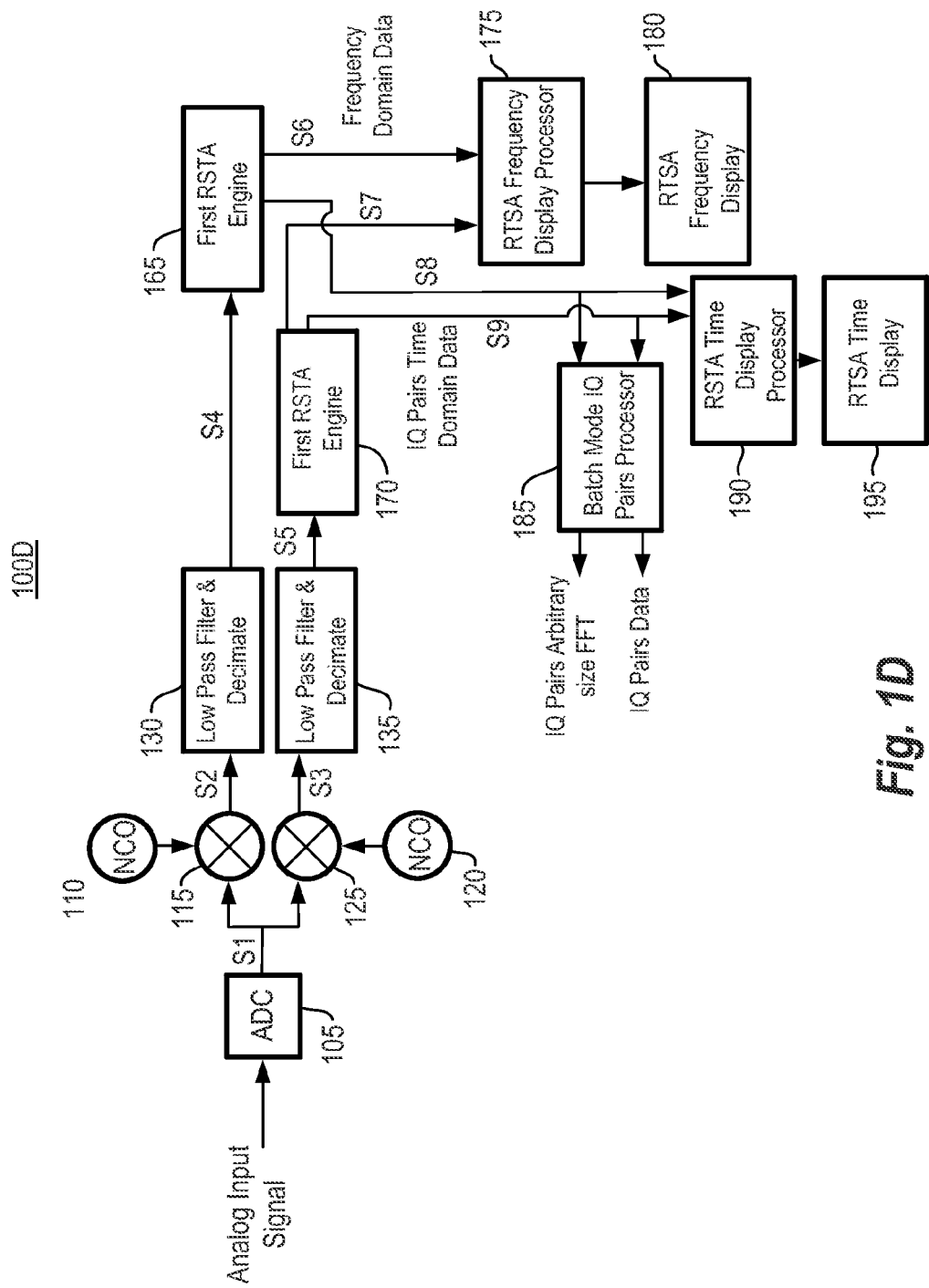
FIG. 1D is a block diagram illustrating another system configured to convert an analog signal into multiple time domain components corresponding to different portions of a cohesive frequency band, and further configured to process the time domain components using different RTSA engines, in accordance with a representative embodiment.

FIGS. 1A-1D are block diagrams illustrating different systems configured to convert an analog signal into multiple time domain components corresponding to different portions of a cohesive frequency spectrum, in accordance with various representative embodiments. In the embodiments of FIG. 1B and FIG. 1C, the system is configured to combine the multiple time domain components into a single output signal. In the embodiment of FIG. 1D, the system is configured to process the time domain components using different RTSA engines.

Referring to FIG. 1A, a system 100A comprises an ADC 105, a first complex numerically controlled oscillator (NCO) 110, a first mixer 115, a second complex NCO 120, a second mixer 125, a first filter 130, and a second filter 135.

During typical operation, ADC 105 receives an analog input signal (i.e., an electronic signal), and it digitizes the signal to produce a stream of digitized data, labeled as stream S1. Stream S1 is in the time domain, and it has a frequency spectrum determined by both the frequency content of the analog input signal and operational characteristics of ADC 105, such as its sampling rate. The frequency spectrum of the stream S1 will be referred to as an original frequency spectrum, and the frequency spectra of other data streams will be derived from the original frequency spectrum.

In the examples illustrated in FIGS. 1A-1D, it will be assumed that the analog input signal of interest has a center frequency (CF) of 877.5 MHz and a bandwidth (BW) of 510 MHz, so its frequency spectrum ranges from 622.5 to 1132.5 MHz. It will be further assumed that ADC 105 performs sampling at a rate of 2400 Mega samples per second (Ms/s). In other words, its sampling frequency (Fs) is equal to 2400 MHz. These and other numerical values presented in this description are merely illustrations intended to provide a clear understanding of the described concepts and are not to be construed as limiting of the described embodiments.

The stream of digitized data is transmitted from the ADC to multiple signal paths. In this example, the number of signal paths is two, although in general it could be any integer number N greater than one (N>1). In a first signal path, first mixer 115 down-converts stream S1 to produce a stream S2 of digitized data having a first frequency spectrum derived from the original frequency spectrum. First mixer 115 performs the down-conversion according to a local oscillator (LO) signal produced by a first complex numerically controlled oscillator (NCO) 110. In a second signal path, second mixer 125 down-converts stream S1 to produce a stream S3 of digitized data having a second frequency spectrum derived from the original frequency spectrum. Second mixer 125 performs the down-conversion according to an LO signal produced by second complex NCO 120.

In the examples illustrated in FIGS. 1A-1D, it will be assumed that first complex NCO 110 produces a complex LO signal with a frequency of 750 MHz and that second complex NCO 120 produces a complex LO signal with a frequency of 1004.296875 MHz. Consequently, first mixer 115 down-converts stream S1 such that the first frequency spectrum, which is associated with stream S2, has a center frequency of 877.5 MHz-750 MHz, or 127.5 MHz. Similarly, second mixer 125 down-converts stream S1 such that the second frequency spectrum, which is associated with stream S3, has a center frequency of 877.5 MHz-1004.296875 MHz, or −126.8 MHz. Due to the real only sampling rate of 2400 MS/s, stream S1 has a total bandwidth of 1200 MHz though the signal of interest has a bandwidth of 510 MHz. Due to the complex down-conversion, streams S2 and S3 have a total bandwidth of 2400 MHz though the bandwidth of the signal of interest remains 510 MHz. Next, streams S2 and S3 are transmitted to first filter 130 and second filter 135, respectively. First filter 130 applies a low-pass filter to stream S2 and decimates the filtered stream by 8 to produce a stream S4. Second filter 135 applies a low-pass filter (or band-pass filter centered at 0 MHz) to stream S3 and decimates the filtered stream by 8 to produce a stream S5. As a consequence of the filtering, stream S4 has a third frequency spectrum that corresponds to a lower portion of the original frequency spectrum, and stream S5 has a fourth spectrum that corresponds to an upper portion of the original frequency spectrum. As a consequence of the decimation, stream S4 and stream S5 both have a complex sampling frequency Fs of 300 MHz. In other words, the complex sampling frequency Fs=2400 MS/s of S2 and S3 is decimated by 8 to produce a new complex sampling frequency Fs=300 MS/s.

As will be apparent from the description of FIGS. 1B, 1C and 1D, stream S4 and stream S5 can be processed and subsequently combined to produce a single output corresponding to the analog input signal. The processing of two separate streams corresponding to respective lower and upper portions of the original frequency spectrum can be viewed as an alternative to processing stream S1 in a single signal pathway. A potential benefit of this alternative approach is that it may allow processing across the full bandwidth of stream S1, even if that bandwidth exceeds the processing capability of electronic components in a single pathway.

Referring to FIG. 1B, a system 100B is similar to system 100A of FIG. 1A, except that it further comprises a processing component P1, a processing component P2, a third mixer 145, a fourth mixer 155, a third NCO 140, a fourth NCO 150, and a combiner 160. Processing components P1 and P2 can perform various forms of processing on respective streams S4 and S5 to produce corresponding output streams in the time domain. Third and fourth mixers 145 and 155 perform up-conversion or down-conversion on the respective streams output by processing components P1 and P2 to produce data streams with frequency spectra corresponding to the original frequency spectrum. More particularly, third mixer 145 performs down-conversion with an LO corresponding to the LO of first mixer 115 (e.g., 750 MHz) minus the original signal center frequency (e.g. 877.5 MHz) or −127.5 MHz, and fourth mixer performs up-conversion with an LO corresponding to the second mixer 125 (e.g., 1004.296875) minus the original signal center frequency (e.g. 877.5 MHz) or +126.8 MHz. Finally, combiner 160 combines the respective data streams produced by third and fourth mixers 145 and 155 to produce a time domain data stream corresponding to the analog input signal.

Referring to FIG. 1C, a system 100C is similar to system 100A of FIG. 1A, except that it further comprises a processing component P1, a processing component P2, a first FFT block 146, a second FFT block 156, a combiner 161 and an IFFT block 162. Processing components P1 and P2 can perform various forms of processing on respective streams S4 and S5 to produce corresponding output streams in the time domain. First and second FFT blocks 146 and 156 convert the time-domain streams to the frequency domain. Combiner 161 performs up-conversion or down-conversion on the respective streams output by processing components P1 and P2 simply by rearranging and concatenating the frequency bins produced by first and second FFT blocks 146 and 156 and adjusting their phase to produce frequency spectra corresponding to the original frequency spectrum. Combiner 161 also fills in the missing portions of the spectra which are outside of the band of interest with values that will allow for an accurate conversion back to the time domain. Finally, IFFT block 162 converts the combined spectra back to the time domain to produce a time domain data stream corresponding to the analog input signal.

Referring to FIG. 1D, a system 100D is similar to system 100A, except that it further comprises a first RTSA engine 165, a second RTSA engine 170, an RTSA frequency display processor 175, an RTSA frequency display 180, and a batch mode IQ processor 185.

First and second RTSA engines 165 and 170 perform various RTSA processing functions on respective streams S4 and S5. These functions may take any of various alternative forms known in the art, and they can be selected according to specific applications and implementations, as will be appreciated by those skilled in the art. As a consequence of those functions, first RTSA engine 165 produces a stream S6 of frequency domain data and a stream S8 of time domain data. Similarly, second RTSA engine 170 produces a stream S7 of frequency domain data and a stream S9 of time domain data. Stream S7 may be identical to stream S4, or it may be some subset of the samples from S4 selected by the first RTSA engine 165. Stream S9 may be identical to stream S5, or it may be some subset of the samples from S5 selected by the second RTSA engine 170.

RTSA frequency display processor 175 processes frequency-domain streams S6 and S7 to produce data to be displayed on RTSA frequency display 180. Examples of the operation of RTSA frequency display processor 175 and RTSA frequency display 180 are illustrated in FIGS. 7A and 7B.

RTSA time display processor 190 processes time-domain streams S8 and S9 to produce data to be displayed on RTSA time display 195. This may be two time domain displays, one each for stream S8 and S9 configured as Power vs. Time as understood by those familiar with the art.

Figure 8A:
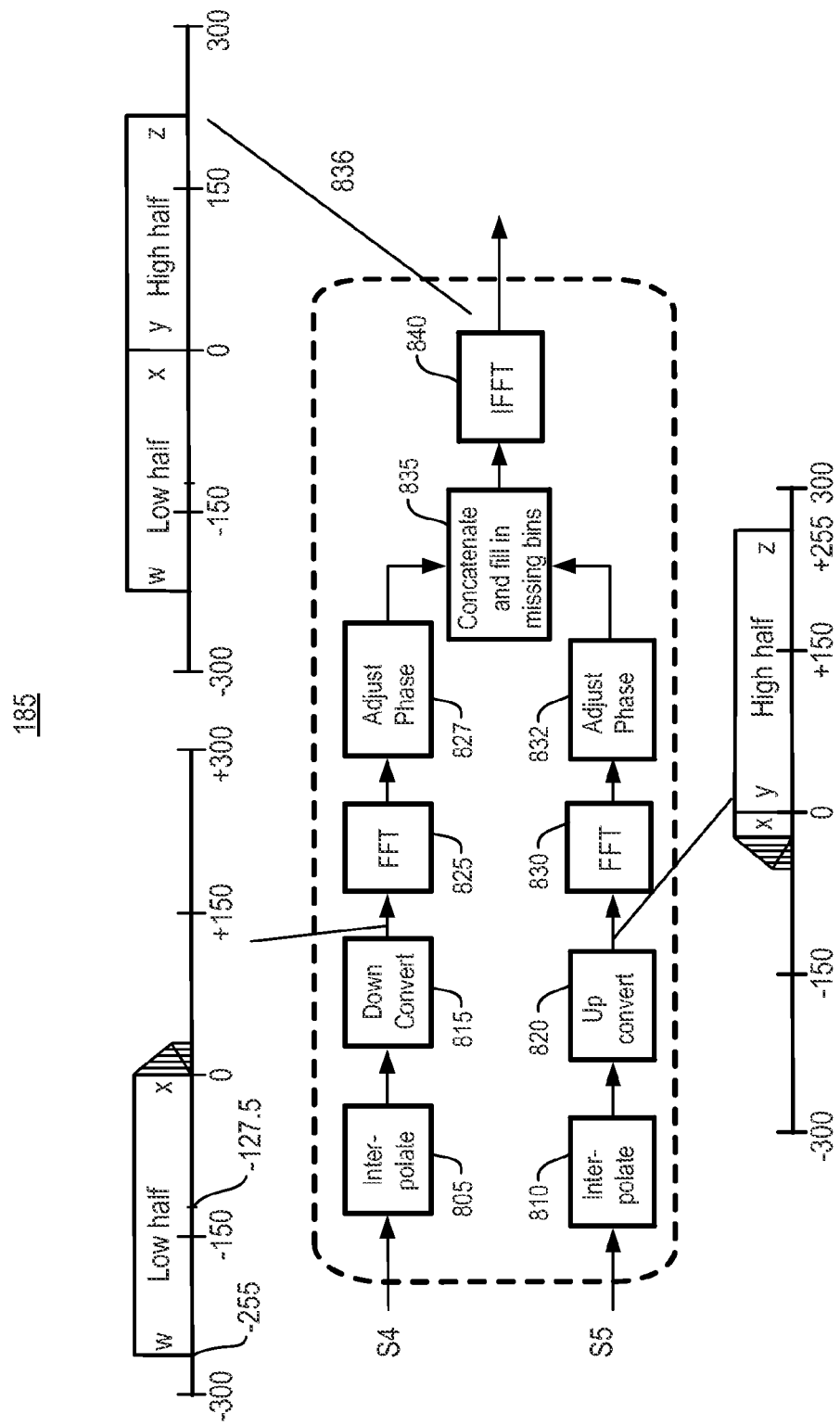
FIG. 8A is a conceptual diagram illustrating the operation of a batch mode in-phase/quadrature (IQ) pairs processor in the system of FIG. 1D, in accordance with a representative embodiment.
Figure 8B:
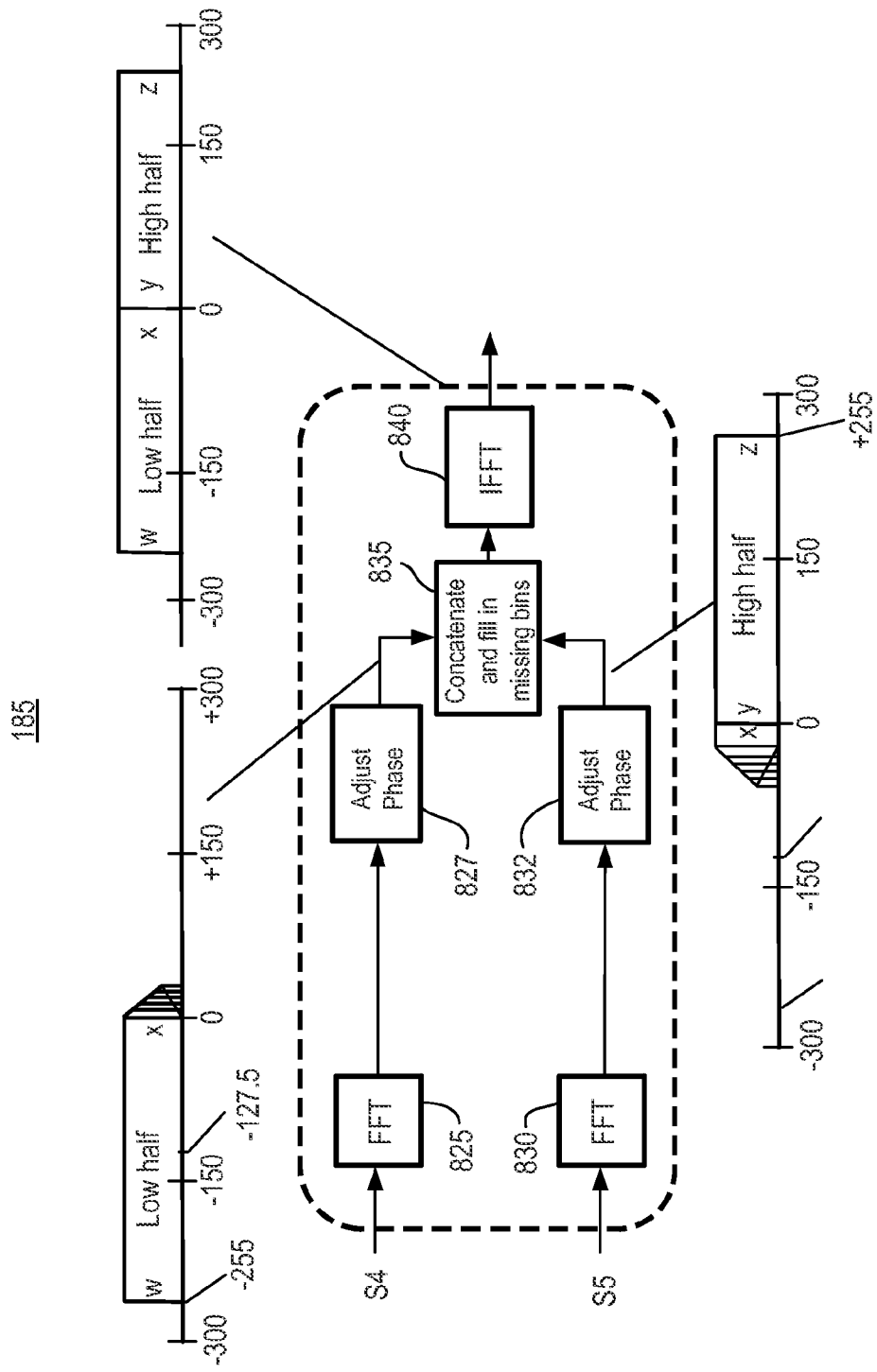
FIG. 8B is a another conceptual diagram illustrating the operation of a batch mode IQ pairs processor in the system of FIG. 1D, in accordance with a representative embodiment.

Batch mode IQ processor 185 processes time-domain streams S8 and S9 to produce IQ pairs data. The IQ pairs data allows the entire 510 MHz of bandwidth to be displayed in the time domain or analyzed as a single coherent signal. Once the time domain streams are combined, the host processor can perform FFTs of any size on the IQ pairs as opposed to the relatively small FFT sizes allowed within the RTSA frequency processing. For example an example RTSA may execute a maximum of a 1024 point FFT. The batch mode processor can do up to 128K or more points in a single FFT which can provide greater frequency resolution and push the noise floor down. An example of the operation of batch mode IQ processor 185 is illustrated in FIG. 8A. An alternative example of batch mode IQ processor 185 is illustrated in FIG. 8B.

FIGS. 2-6 are graphs illustrating the frequency spectra of streams S1-S9 in system 100D of FIG. 1D, in accordance with a representative embodiment. These graphs provide numerical values for one operational example in order to illustrate the function of system 100D. However, these numerical values are not to be construed as limiting of system 100D or other embodiments.

Figure 2:
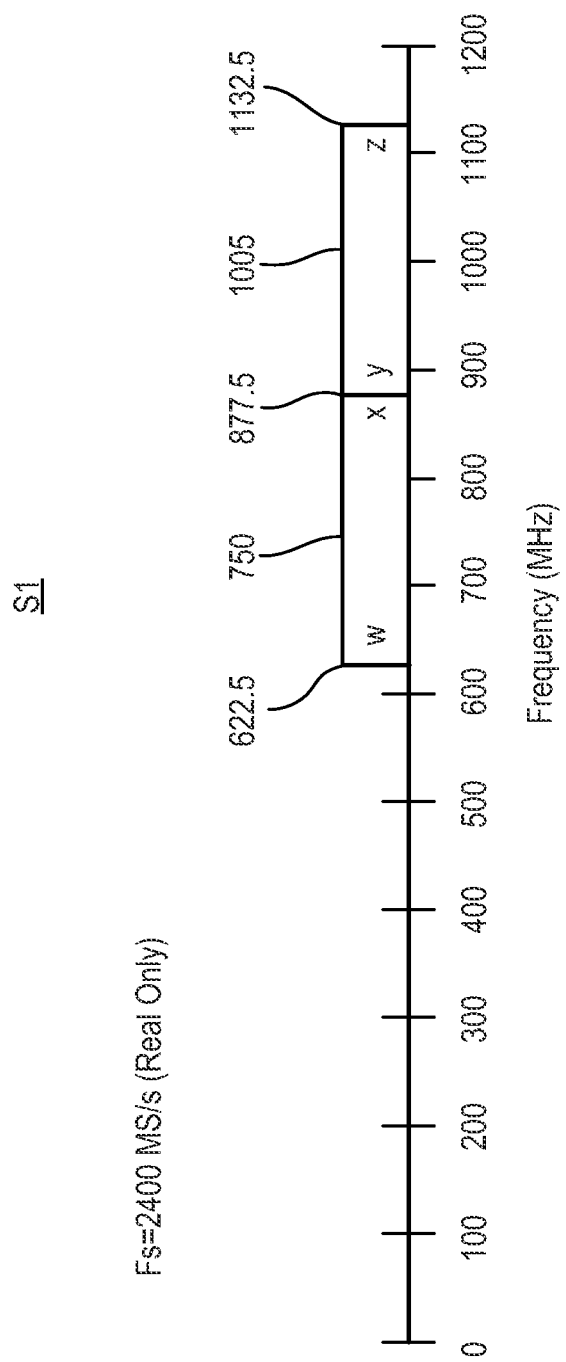
FIG. 2 is a graph illustrating a frequency spectrum of a stream of digitized data produced by the system of FIG. 1D, in accordance with a representative embodiment.

FIG. 2 is a graph illustrating a frequency spectrum of stream S1, in accordance with a representative embodiment.

Referring to FIG. 2, stream S1 has a frequency spectrum with a center frequency of 877.5 and a bandwidth of 510 MHz ranging from 622.5 MHz to 1132.5 MHz. A lower portion of the frequency spectrum is delimited by the reference characters "w" and "x", and an upper portion of the frequency spectrum is delimited by the reference characters "y" and "z". The lower portion may be referred to as spectrum w-x, and the upper portion may be referred to as spectrum y-z. Stream S1 has a real only sampling frequency Fs=2400 MS/s, and it comprises only real data, i.e., amplitude with zero phase.

Figure 3:
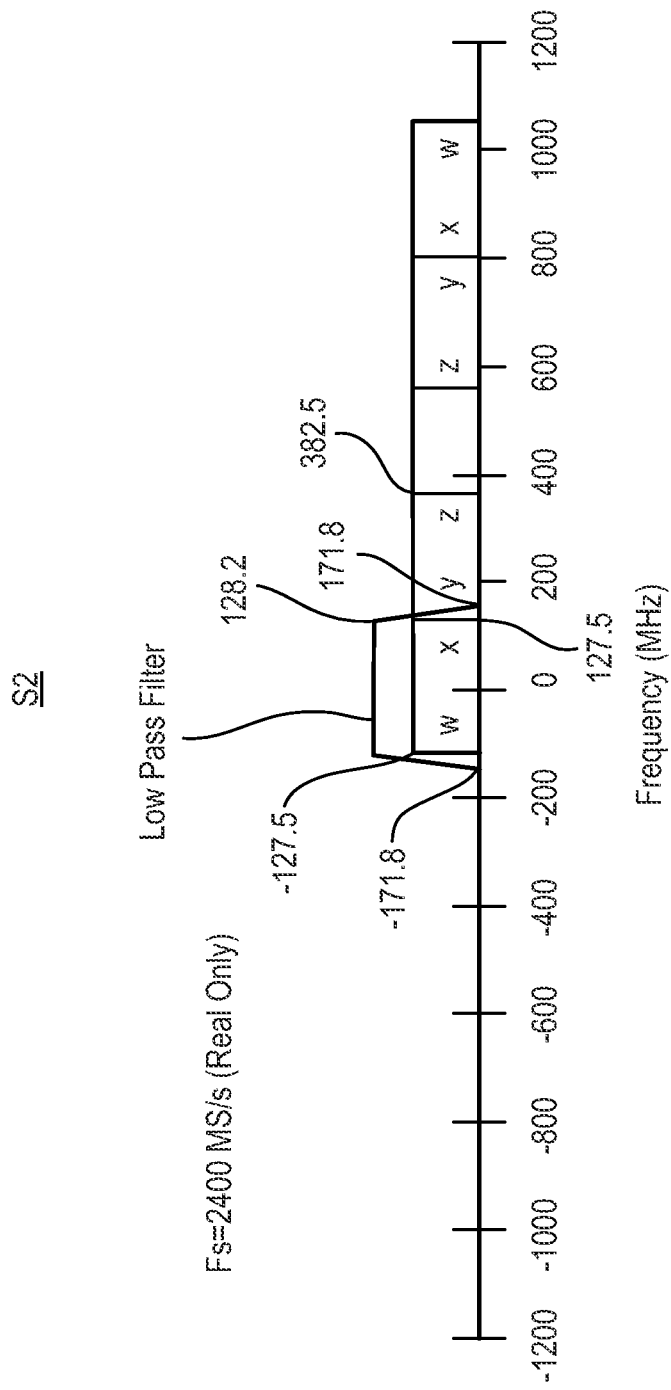
FIG. 3 is a graph illustrating a frequency spectrum of the stream of digitized data illustrated in FIG. 2 after complex down-conversion using a first local oscillator signal, in accordance with a representative embodiment.

FIG. 3 is a graph illustrating a frequency spectrum of stream S2, in accordance with a representative embodiment.

Referring to FIG. 3, stream S2 is produced by mixing stream S1 with a complex LO of 750 MHz so that the resulting down-converted spectrum w-x is centered at 0 MHz and has respective upper and lower frequencies at 127.5 and −127.5 MHz. As illustrated in FIG. 3, stream S2 is subsequently filtered by a low-pass filter, which has upper and lower cutoff frequencies of 128.2 MHz and −128.2 MHz, respectively. This filtering preserves the down-converted spectrum w-x while substantially removing other frequency components of stream S2. Stream S2 has a complex sampling frequency Fs=2400 MS/s, and it comprises complex data, i.e., IQ data.

Figure 4:
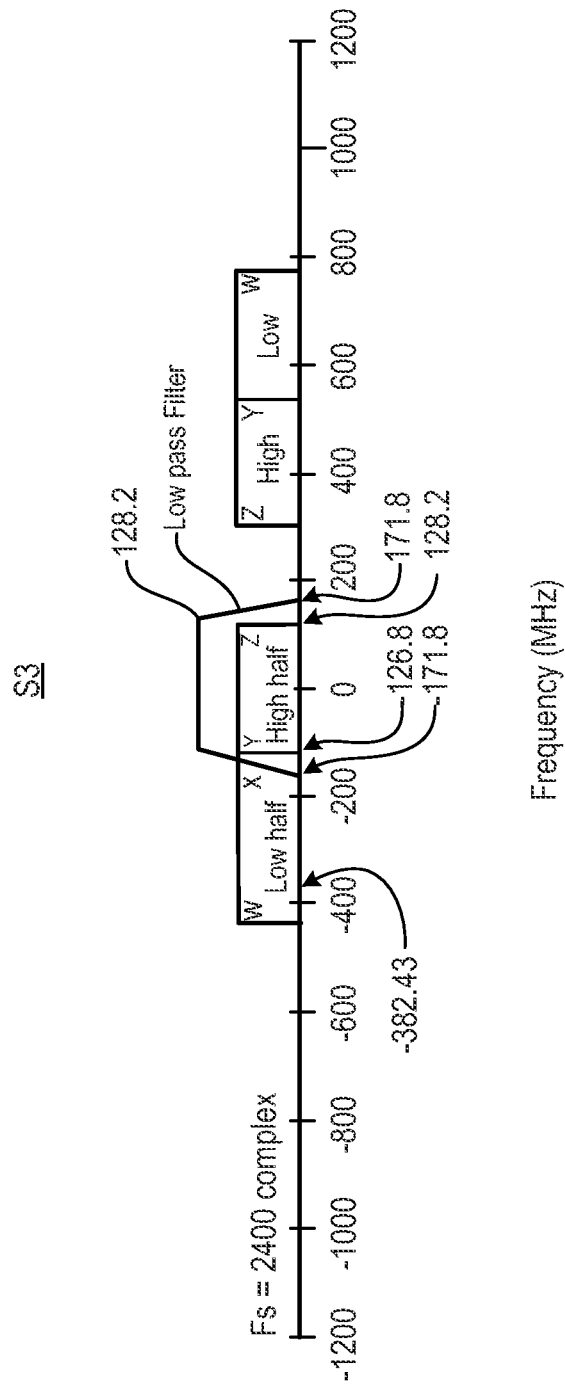
FIG. 4 is a graph illustrating a frequency spectrum of the stream of digitized data illustrated in FIG. 2 after complex down-conversion using a second local oscillator signal, in accordance with a representative embodiment.

FIG. 4 is a graph illustrating a frequency spectrum of stream S3, in accordance with a representative embodiment.

Referring to FIG. 4, stream S3 is produced by mixing stream S1 with an LO of 1004.296875 MHz so that the resulting down-converted spectrum y-z is centered at approximately 0 MHz and has respective upper and lower frequencies at 128.2 and −126.8 MHz. As illustrated in FIG. 4, stream S3 is subsequently filtered by a low-pass filter, which has upper and lower cutoff frequencies of 128.2 MHz and −128.2 MHz, respectively. This filtering preserves the down-converted spectrum y-z while substantially removing other frequency components of stream S3. Stream S3 has a complex sampling frequency Fs=2400 MS/s, and it comprises complex data, i.e., IQ data.

Figure 5:
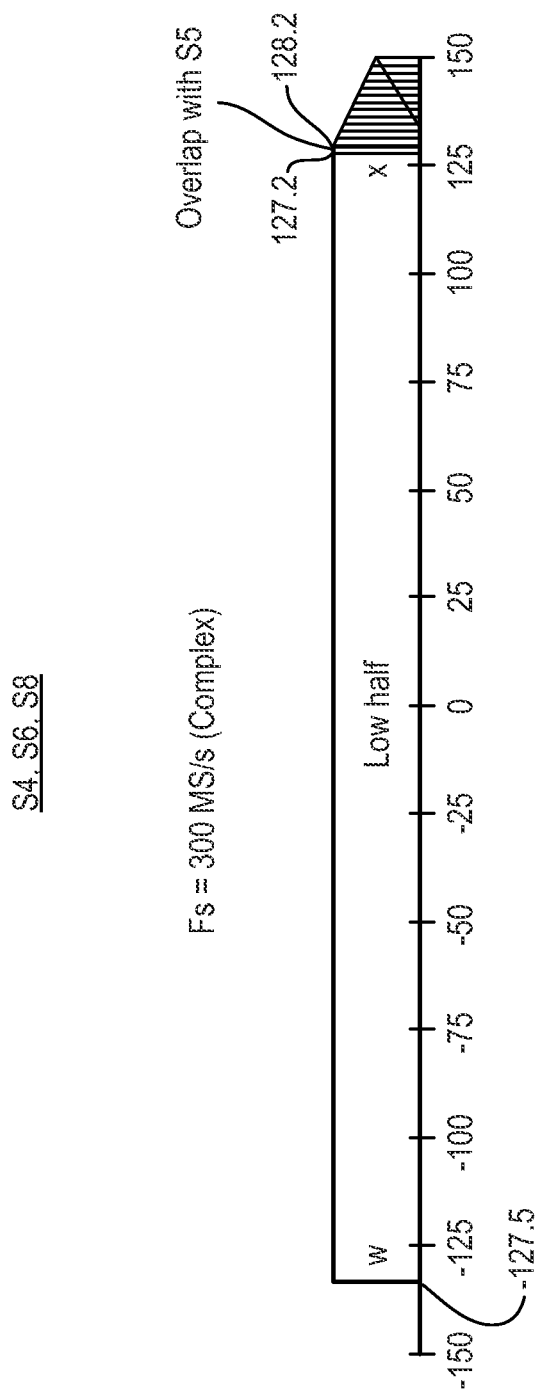
FIG. 5 is a graph illustrating a frequency spectrum of the stream of digitized data illustrated in FIG. 3 after low-pass filtering and decimation, in accordance with a representative embodiment.

FIG. 5 is a graph illustrating a frequency spectrum of streams S4, S6, an S8. Each of these streams has substantially the same frequency spectrum, although in system 100D, streams S4 and S8 are in the time domain and stream S6 is in the frequency domain.

Referring to FIG. 5, the illustrated streams have frequency spectra with a center frequency at 0 Hz and upper and lower frequencies at 150 and −150 MHz, while the signal of interest, w-x, extends from 127.5 to −127.5 MHz. The illustrated streams have a complex sampling frequency Fs of 300 MHz, which is a consequence of decimation performed by first filter 130. Because the lowpass filter cutoff of FIG. 4 extends to +128.2 MHz, some small part of the spectrum segment y-z is present extending from +127.5 to +128.2 MHz.

Figure 6:
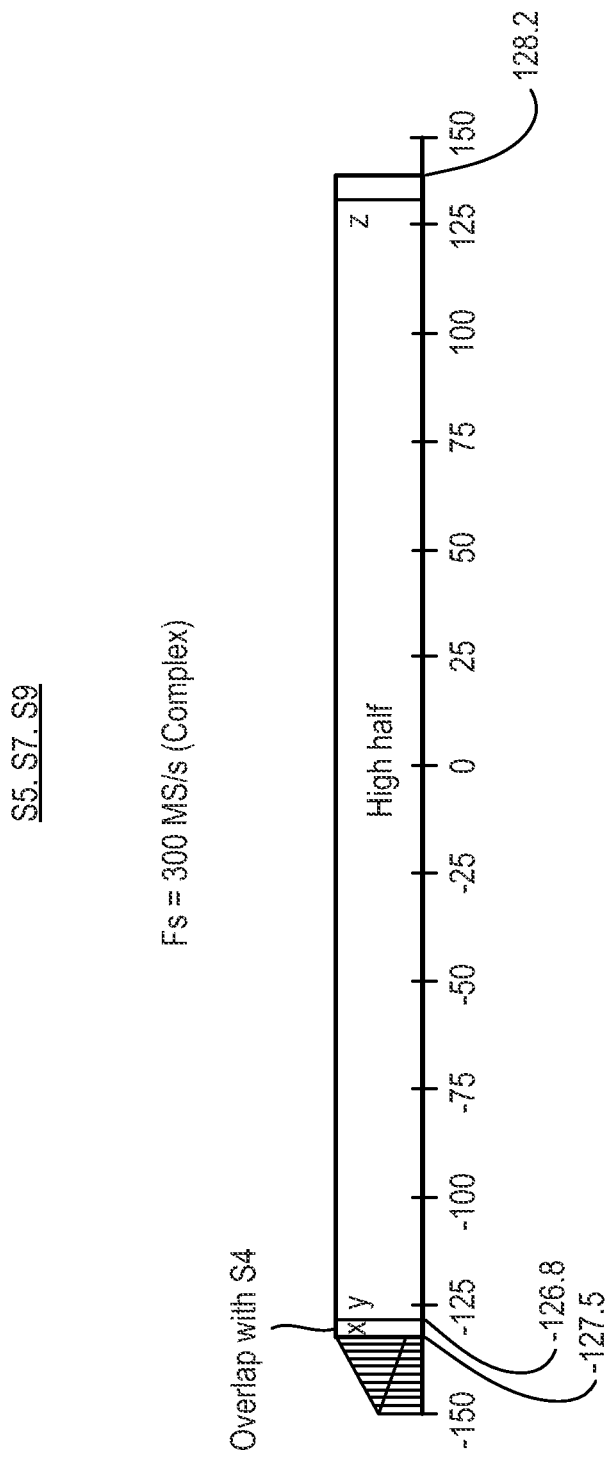
FIG. 6 is a graph illustrating a frequency spectrum of the stream of digitized data illustrated in FIG. 4 after low-pass filtering and decimation, in accordance with a representative embodiment.

FIG. 6 is a graph illustrating a frequency spectrum of streams S5, S7, an S9. Each of these streams has substantially the same frequency spectrum, although in system 100D, streams S5 and S9 are in the time domain and stream S7 is in the frequency domain.

Referring to FIG. 6, the illustrated streams have frequency spectra with a center frequency at approximately 0 Hz and upper and lower frequencies at 150 and −150 MHz, while the signal of interest, yz, extends from +128.2 to −126.8 MHz. The illustrated streams have a complex sampling frequency Fs of 300 MHz, which is a consequence of decimation performed by second filter 135. Because the lowpass filter cutoff of FIG. 4 extends to −128.2 MHz, some small part of the spectrum segment wx is present (extending from −126.8 to −128.2 MHz). The fact that each of the spectra in FIG. 5 and FIG. 6 have an overlapped portion with the other is necessary for obtaining information needed to later recombine the streams. FIG. 7A is a conceptual diagram illustrating the operation of RTSA frequency display processor 175 in the system of FIG. 1D, in accordance with a representative embodiment. FIG. 7B is a conceptual diagram illustrating the operation of RTSA frequency display 180 in the system of FIG. 1D, in accordance with a representative embodiment. Collectively, FIGS. 7A and 7B illustrate how streams S6 and S7, which are in the frequency domain, are processed and combined to produce display data for RTSA frequency display 180.

Referring to FIG. 7A, stream S6 is produced by first RTSA engine 165 performing a fast Fourier transform (FFT) on time domain stream S4. In the illustrated example, the FFT maps stream S4 onto 1024 frequency bins across a range of frequencies between −150 MHz and 150 MHz. Under these circumstances, each frequency bin spans 300 MHz/1024=292.96875 KHz. Among the 1024 frequency bins, RTSA frequency display processor 175 uses 871 bins to produce display data for RTSA frequency display 180. These 871 bins are labeled as bins −435 through 435, as indicated by a bar denoting their locations relative to the frequency spectrum of stream S6.

Similarly, stream S7 is produced by second RTSA engine 170 performing an FFT on time domain stream S5 to map it onto 1024 frequency bins across a range of frequencies between −150 MHz and 150 MHz. Of those 1024 frequency bins, RTSA frequency display processor 175 uses 871 bins to produce display data for RTSA frequency display 180. These 871 bins are labeled as bins −435 through 435, as indicated by a bar denoting their locations relative to the frequency spectrum of stream S7. Alternately, bins −433 through 437 (also labeled) could be the ones kept for display.

As indicated by the label "x" in the frequency spectrum of stream S7, there is an overlap between some of the frequency bins associated with stream S6 and some of the frequency bins associated with stream S7. The location of this overlap is indicated in Table 1 below. The overlap can be used to confirm that the respective lower and upper portions of the original frequency spectrum, which are processed in separate signal paths of system 100D, are properly aligned when they are recombined, e.g., for display on RTSA frequency display 180. Where the lower and upper portions are properly aligned, the overlapping frequency bins should have substantially the same values. In other words, they should be substantial duplicates of each other.

TABLE 1

| Bin Number - Stream S6 | Center Frequency | Frequency Before Down-conversion (750 MHz Higher) |
|---|---|---|
| 432 | 126.562500 MHz | 876.562500 MHz |
| 433 | 126.85546875 MHz | 876.85546875 MHz |
| 434 | 127.1484375 MHz | 877.1484375 MHz |
| 435 | 127.441406.25 MHz | 877.441406.25 MHz |

| Bin Number - Stream S7 | Center Frequency | Frequency Before Down-conversion (1004.296875 MHz Higher) |
|---|---|---|
| −433 | −126.85546875 MHz | 877.441406.25 MHz |
| −434 | −127.1484375 MHz | 877.1484375 MHz |
| −435 | −127.441406.25 MHz | 876.85546875 MHz |

As shown in Table 1, frequency bin 433 of stream S6 matches frequency bin −435 of stream S7. More specifically, these frequency bins correspond to the same frequency of the original frequency spectrum, i.e., before down-conversion. Similarly, frequency bin 434 of stream S6 matches frequency bin −434 of stream S7, and frequency bin 435 of stream S6 matches frequency bin −433 of stream S6. If bins −435 through 435 of S7 are kept, there are 3 overlapping bins as discussed. If bins −433 through 437 are kept there is only one overlapping bin. Note that when there are 3 overlapping bins, a small portion of spectrum y-z is lost. When there is one overlapping bin, all of spectrum y-z is included. Therefore the overlap may be set to 3 during calibration and set to 1 during measurement display. It should be understood that the amount of overlap used in these examples is for illustrative purposes only and that it could be made larger if desired for other reasons.

During a calibration procedure, system 100D may confirm that the overlapping frequency bins have substantially the same values. In other words, it may confirm that frequency bin 433 of stream S6 has substantially the same value as frequency bin −435 of stream S7, and so on. If the overlapping frequency bins do not have substantially the same values, first and second complex NCOs 110 and 120 may be adjusted to achieve alignment.

Referring to FIG. 7B, RTSA frequency display processor 175 concatenates frequency bins −435 to +435 of stream S6 (871 bins) with frequency bins −432 to 435 of stream S7 (868 bins) and transmits the resulting data stream to RTSA frequency display 180. As illustrated in FIG. 7B, for the case of an overlap of 3 bins, the resulting display comprises 1739 frequency bins for a total bandwidth of 509.47256 MHz. Not shown is a case of an overlap of 1 bin where the resulting display would use bins −432 through 437 of S7 in which the resulting display comprises 1741 frequency bins for a total bandwidth of 510.0585938 MHz.

FIG. 8A is a conceptual diagram illustrating the operation of batch mode IQ pairs processor 185 in system 100D, in accordance with a representative embodiment.

Referring to FIG. 8A, batch mode IQ pairs processor 185 comprises first and second interpolation units 805 and 810, a down-converter 815, an up-converter 820, first and second FFT units 825 and 830, phase adjustment units 827 and 832, a concatenation unit 835, and an inverse FFT (IFFT) unit 840.

During typical operation, first and second interpolation units 805 and 810 receive respective time-domain streams S4 and S5 and perform interpolation on those streams. For explanation purposes, it will be assumed that each of the interpolation units takes 512 points from the corresponding stream and interpolates those points by a factor of 2 from sampling frequency Fs=300 S/s to sampling frequency Fs=600 S/s to give 1024 points. Next, down-converter 815 down-converts the interpolated version of stream S4 such that its center frequency is located at −127.5 MHz, and up-converter 820 up-converts the interpolated version of stream S5 such that its center frequency is located at 127.5 MHz. The resulting data streams are then transformed into the frequency domain by first and second FFT units 825 and 830 which do 1024 point FFTs, and then the corresponding FFT results have their phase adjusted by phase adjustment units 827 and 832 and are then are concatenated by concatenation unit 835 which also fills in missing spectral information. Missing spectral information may be filled in by interpolating the real and imaginary parts such that the filled in bins smoothly transition between the known bins. This may be a linear interpolation or any of a number of interpolation techniques known to those skilled in the art. Information used to adjust phase can come either from signal in the overlapping bins or from stored phase information from the phase accumulators used in first and second complex NCOs 110 and 120. As in the example of FIGS. 7A and 7B, concatenation can be performed according to an alignment between frequency bins of the two components being concatenated, and the alignment can be adjusted according to a calibration procedure. In the example of FIG. 8A, the concatenated data stream will comprise frequency bins −512 through 0 of the FFT result produced by first FFT unit 825, and frequency bins 3 to 511 of the FFT result produced by second FFT unit 830. This leaves a couple of missing bins plus a range of spectra (bins −436 to −512 and bins 434 to 511) comprising only noise (since the signal in that region was filtered out by the lowpass filter). These bins are multiplied by a frequency domain response (low pass filter) which leaves the signal range on interest unchanged and tapers the noise and filled in parts of the spectrum smoothly down to a much lower magnitude. This is the equivalent of a convolution in the time domain with a 257 point impulse response and serves to minimize errors introduced by the inexact knowledge of the filled in bins. Accordingly, the concatenated FFT data will comprise a total of 1024 frequency bins having a sampling rate Fs=600 MS/s complex and signal bandwidth of 510 MHz.

Finally, IFFT unit 840 converts the concatenated frequency-domain stream from the frequency domain back into the time domain. This conversion is a 1024 point IFFT, and it produces 1024 time domain points with sampling frequency Fs=600 MS/s complex and bandwidth of 510 MHz. This time domain signal represents the original 1024 time points (512 each from stream S8 and S9) convolved with the impulse response corresponding to the frequency domain multiply done by the concatenation unit 835. This convolution would yield 1278 points of which 256 each at the beginning and end would be the tails of the convolution. The IFFT produces 1024 points of which 256 represent the beginning and ending convolution tails time-domain aliased on each other as well as 768 points that are usable. The overlapping tails of the convolution (256 points) are discarded and 768 time points remain which are the combined stream. The first 128 points from each stream are effectively not combinable (as well as the final 128 in the final batch of points) because of the convolution tails. Therefore the system is directed to capture at least 256 points in each stream more than is requested as the combined output stream. For the next batch of points, 768 new points are taken (384 from each stream) while keeping 256 points (128 from each stream) from the previous batch. In this way, 384 points from each stream at a time, overlapped by 128 with the previous batch of points, we process all the stored points until they are all combined. The first batch has a total of 1024 points in and 768 out. After that, each batch includes 768 new points (plus 256 old points) in and 768 new points out. FIG. 8B is a conceptual diagram illustrating another possible operation of batch mode IQ pairs processor 185 in system 100D, in accordance with a representative embodiment.

Referring to FIG. 8B, batch mode IQ pairs processor 185 comprises first and second FFT units 825 and 830, phase adjustment units 827 and 832, a concatenation unit 835, and an IFFT unit 840.

During typical operation, first and second FFT units 825 and 830 receive respective time-domain streams S4 and S5 and perform a 512 point FFT on those streams. For explanation purposes, it will be assumed that each of the interpolation units takes 512 points from the corresponding stream.

Next, the corresponding FFT results have their phase adjusted by phase adjustment units 827 and 832 and are then are concatenated by concatenation unit 835 which also fills in missing spectral information. Information used to adjust phase can come either from signal in the overlapping bins or from stored phase information from the phase accumulators used in first and second complex NCOs 110 and 120. Missing spectral information may be filled in by interpolating the real and imaginary parts such that the filled in bins smoothly transition between the known bins. This may be a linear interpolation or any of a number of interpolation techniques known to those skilled in the art.

As in the example of FIGS. 7A and 7B, concatenation can be performed according to an alignment between frequency bins of the two components being concatenated, and the alignment can be adjusted according to a calibration procedure. In the example of FIG. 8B, the concatenated FFT spectra will comprise frequency bins −256 through +217 of the FFT result produced by first FFT unit 825 (mapped to bins −474 to zero of the concatenated FFT), and frequency bins −215 to +255 of the FFT result produced by second FFT unit 830 (mapped to bins 1 to 471 of the concatenated FFT). This leaves a number of missing bins (−512 to −475 and 472 to 511) plus a range of spectra (bins −436 to −475 and bins 434 to 471) that are comprised of only noise (since the signal in that region was filtered out by the lowpass filter. Missing spectral information may be filled in by interpolating the real and imaginary parts such that the filled in bins smoothly transition between the known bins. This may be a linear interpolation or any of a number of interpolation techniques known to those skilled in the art. The resulting frequency response is multiplied by a frequency domain response (low-pass filter) which leaves the signal range on interest unchanged and tapers the noise part of the spectrum smoothly down to a much lower magnitude. This serves to minimize errors introduced by the filling in of the missing bins. This is the equivalent of a convolution in the time domain with a 257 point impulse response. Accordingly, the concatenated FFT will comprise a total of 1024 frequency bins having a sampling rate Fs=600 MS/s complex and signal bandwidth of 510 MHz.

Finally, IFFT unit 840 converts the concatenated frequency-domain stream from the frequency domain back into the time domain. This conversion is a 1024 point IFFT, and it produces 1024 time domain points with sampling frequency Fs=600 MS/s complex and bandwidth of 510 MHz. This time domain signal represents the original 1024 time points (512 each from stream S8 and S9) convolved with the impulse response corresponding to the frequency domain multiply done by the concatenation unit 835. This convolution would yield 1278 points of which 256 each at the beginning and end would be the tails of the convolution. The IFFT produces 1024 points of which 256 represent the beginning and ending convolution tails time-domain aliased on each other as well as 768 points that are usable. The overlapping tails of the convolution (256 points) are discarded and 768 time points remain which are the combined stream. For the next batch of points, 768 new points are taken (384 from each stream) while keeping 256 points (128 from each stream) from the previous batch. In this way, 384 points from each stream at a time, all of the stored points are processed until they are all combined. Note that the first 128 points from each stream cannot be effectively combined because they become part of a discarded convolution tail. So the first batch has a total of 1024 points in and 768 out. After that, each batch includes 768 new points (with 256 old points) in and 768 new points out. Similarly, the last 128 points from each stream in the last batch cannot be combined. Therefore, a total of 512 points (256 from each stream) more than requested are stored to combine for the finished measurement.

It should be noted that the phase adjustment units 827 and 832 in FIGS. 8A and 8B compensate for the fact that first and second complex NCOs 110 and 120 in FIGS. 1A, 1B and 1C, will shift the phase of stream S2 and S3 by different amounts. The information for this adjustment may come from the NCOs by latching the phase accumulator values corresponding to the first stored sample. An alternative method can be used if there is sufficient signal magnitude (approximately 40 dB signal to noise ratio) available in any of the overlapping frequency bins. For example in the concatenated FFTs in FIGS. 8A and 8B, bin zero corresponds to zero Hz and is an overlapped bin.

By definition, the phase of a signal at zero Hz is zero phase. The entire phase trace of each FFT output may be rotated to bring bin zero to zero phase. For example if the output of first FFT unit 825 has phase of 0.5 radians in the bin that will be mapped to zero Hz, subtract 0.5 radians from all its phase values. Meanwhile if the output of second FFT unit 830 has phase of 2.1 radians in the bin that will be mapped to zero Hz, subtract 2.1 radians from all its phase values. Then the two FFT results may be concatenated as already described. If the overlapped bin used as the phase reference is other than the zero Hz bin because there is insufficient signal present in bin zero, then adjust the first FFT to have zero phase in bin zero, and adjust the other FFT to have matching phase in the reference bin.

Figure 9:
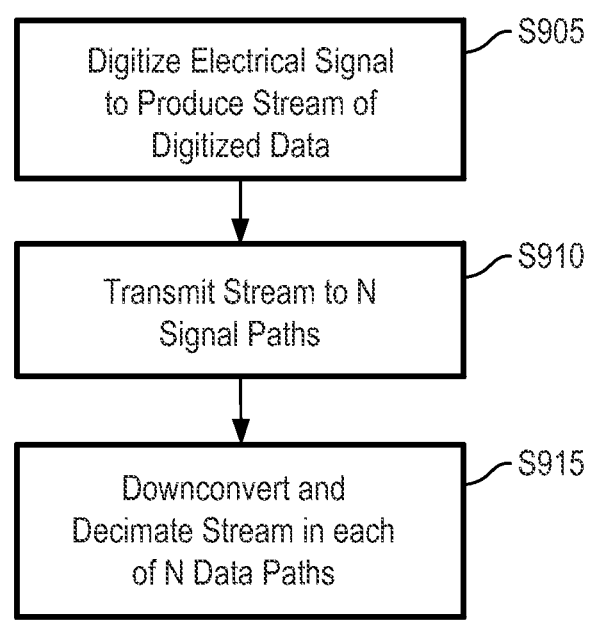
FIG. 9 is a flowchart illustrating a method of operating the system of FIG. 1A, in accordance with a representative embodiment.

FIG. 9 is a flowchart illustrating a method 900 of operating the system of FIG. 1A, in accordance with a representative embodiment.

Referring to FIG. 9, method 900 comprises digitizing an electrical signal to produce a stream of digitized data in the time domain, wherein the stream has an original frequency spectrum (S905). In the example of FIG. 1A, the digitization is performed by ADC 105. Method 900 further comprises transmitting the stream to N signals paths, where N can be any integer greater than one (S910). In the example of FIG. 1A, N=2. Finally, method 900 comprises down-converting the stream in each of the N signal paths to produce N streams of digitized data in the time domain, wherein the N streams have N frequency spectra, respectively, the N frequency spectra cover N different portions of the original frequency spectrum, respectively (S915). In addition to down-conversion, the method may also decimate each of the N streams as illustrated in FIG. 1A, for instance.

Figure 10A:
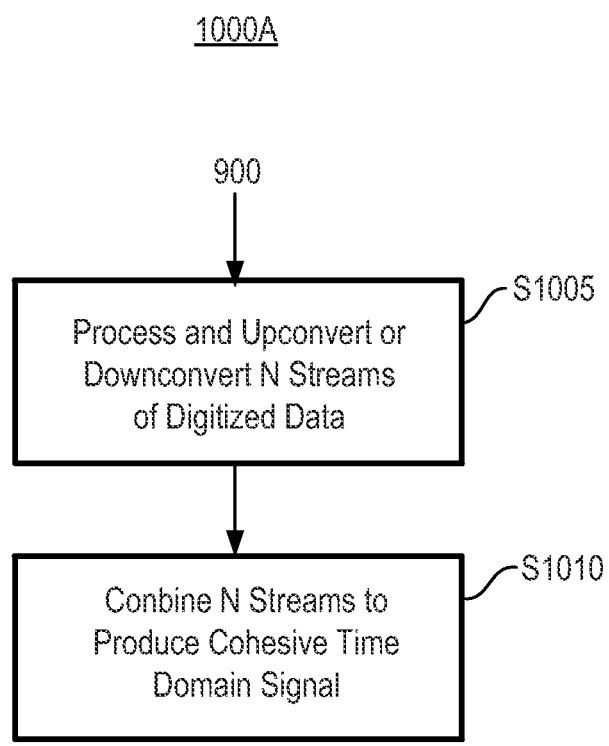
FIG. 10A is a flowchart illustrating a method of operating the system of FIG. 1B, in accordance with a representative embodiment.

FIG. 10A is a flowchart illustrating a method 1000A of operating the system of FIG. 1B, in accordance with a representative embodiment.

Referring to FIG. 10A, method 1000A begins by performing the operations of method 900. Thereafter, the N streams of digitized data are processed and up-converted or down-converted as illustrated in FIG. 1B (S1005), and the processed streams are combined to produce a cohesive time domain signal (S1010).

Figure 10B:
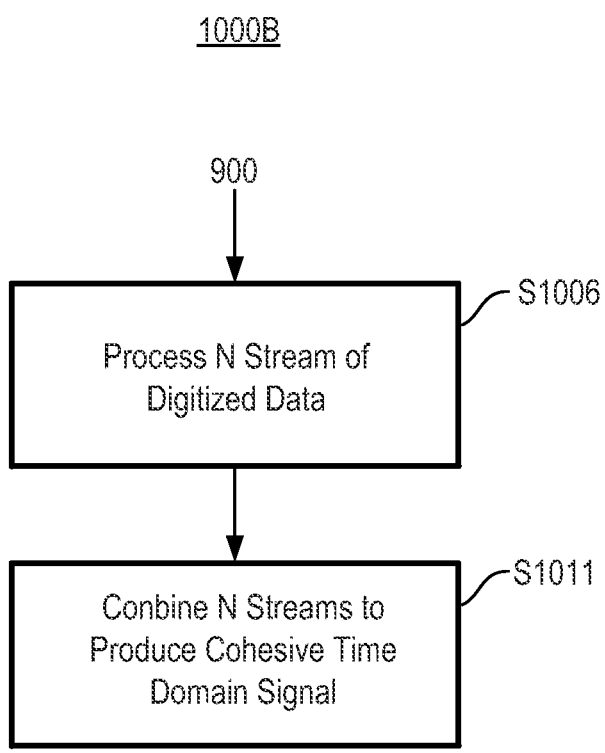
FIG. 10B is a flowchart illustrating a method of operating the system of FIG. 1C, in accordance with a representative embodiment.

FIG. 10B is a flowchart illustrating a method 1000B of operating the system of FIG. 1C, in accordance with a representative embodiment.

Referring to FIG. 10B, method 1000B begins by performing the operations of method 900. Thereafter, the N streams of digitized data are processed as illustrated in FIG. 1C (S1006), and the processed streams are combined to produce a cohesive time domain signal (S 1011).

Figure 11:
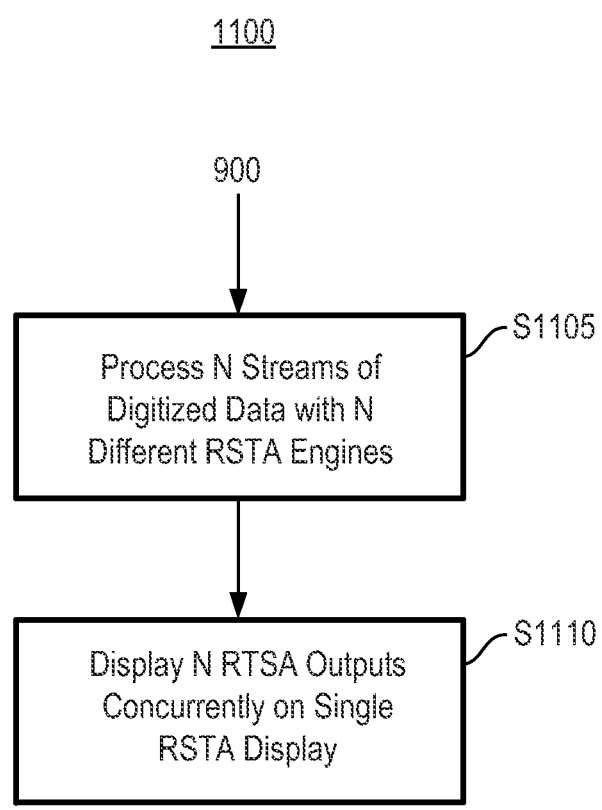
FIG. 11 is a flowchart illustrating a method of operating the system of FIG. 1D, in accordance with a representative embodiment.

FIG. 11 is a flowchart illustrating a method 1100 of operating the system of FIG. 1D, in accordance with a representative embodiment.

Referring to FIG. 11, method 1100 begins by performing the operations of method 900. Method 1100 then proceeds by processing the N streams using N different RTSA engines to produce N RTSA outputs (S1105) and then displaying the N RTSA outputs concurrently on a single RTSA display (S 1110). In the example of FIG. 1D, these operations can be performed as described in FIGS. 2-8.

In certain embodiments, the operations performed in each of the N signal paths may be synchronized by external control signals and/or embedded synchronization data within the N streams of data. For example, in one embodiment, the method further comprises embedding synchronization data in each of the N streams, inspecting the synchronization data in each of the RTSA engines, and communicating between the RTSA engines in response to the synchronization data to synchronize the processing of the N streams.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A system configured to process an electrical signal, comprising:
an analog to digital converter (ADC) configured to digitize the electrical signal to produce a stream of digitized data in the time domain, wherein the stream has an original frequency spectrum, wherein the ADC provides the stream to N signal paths N signal paths (N>1) each configured to down-convert and filter the stream to produce N streams of digitized data in the time domain, wherein the N streams have N frequency spectra, respectively, and the N frequency spectra cover N different portions of the frequency spectrum, respectively;
N different real-time spectrum analyzer (RTSA) engines configured to process the N streams to produce N RTSA outputs by performing a Fourier transform on each of the streams;
and identifying overlapping frequency bins between different streams among the N streams;
a display configured, to display the N RTSA outputs concurrently on a single RTSA display, wherein an alignment of the different streams within the RTSA display is determined according to the overlapping frequency bins.

2. The system of claim 1, wherein each of the N signal paths comprises a frequency mixer configured to down-convert the stream and a band-pass filter configured to filter the down-converted stream.

3. The system of claim 1, further comprising a component configured to transform each of the N streams from the time domain to the frequency domain adjust the phase, and concatenate the transformed N streams.

4. The system of claim 1, further comprising a component configured to synchronize operations of the N signal paths by embedding synchronization data in each of the N streams and inspecting the synchronization data in each of the N signal paths.

5. The system of claim 2, wherein the frequency mixer in each of the N signal paths has a different local oscillator (LO) frequency than the frequency mixer in each of the other N signal paths.

6. The system of claim 2, further comprising:
N real-time spectrum analyzer (RTSA) engines configured to process the N streams, respectively, to produce N RTSA outputs; and
an RTSA display processor configured to combine the N RTSA outputs into a single cohesive frequency spectrum.

7. The system of claim 3, wherein the component is further configured to inversely transform the concatenated and transformed N streams from the frequency domain to the time domain.

8. The system of claim 3, wherein concatenation of the transformed N streams comprises aligning corresponding frequency bins of the transformed N streams and adjusting the phase of all the frequency bins.

9. The system of claim 6, further comprising a display configured to display the single cohesive frequency spectrum produced by the RTSA display processor.

10. A method of processing an electrical signal, comprising:
digitizing the electrical signal to produce a stream of digitized data in the time domain, wherein the stream has an original frequency spectrum;
transmitting the stream to N signal paths (N>1);
down-converting and filtering the stream in each of the N signal paths to produce N streams of digitized data in the time domain, wherein the N streams have N frequency spectra, respectively, and the N frequency spectra cover N different portions of the original frequency spectrum, respectively;
processing the N streams using N different real-time spectrum analyzer (RTSA) engines to produce N RTSA outputs;
displaying the N RTSA outputs concurrently on a single RTSA display, wherein processing the N streams comprises: performing a Fourier transform on each of the N streams to produce a plurality of frequency bins corresponding to each of the N streams; and identifying overlapping frequency bins between different streams among the N streams; and
determining an alignment of the different streams within the RTSA display according to the overlapping frequency bins.

11. The method of claim 10, further comprising:
embedding synchronization data in each of the N streams; and inspecting the synchronization data in each of the RTSA engines and communicating between the RTSA engines in response to the synchronization data to synchronize the processing of the N streams.

12. The method of claim 10, further comprising, after the performing the Fourier transform:
   adjusting the phase of the N transformed streams;
   concatenating the N transformed streams to produce a concatenated stream; and
   performing an inverse Fourier transform (IFT) on the concatenated stream.

13. The method of claim 10, wherein the stream represents the electrical signal using magnitude and phase data (IQ data).

14. The method of claim 10, wherein filtering the stream is performed in each of the N signal paths by a band-pass filter centered at approximately 0 MHz.

15. The method of claim 11, wherein N=2.

* * * * *